US011615944B2

(12) United States Patent
Olsen et al.

(10) Patent No.: US 11,615,944 B2
(45) Date of Patent: Mar. 28, 2023

(54) REMOTE PLASMA OXIDATION CHAMBER

(71) Applicant: Applied Materials, Inc., Santa Clara, CA (US)

(72) Inventors: Christopher S. Olsen, Fremont, CA (US); Eric Kihara Shono, San Mateo, CA (US); Lara Hawrylchak, Gilroy, CA (US); Agus Sofian Tjandra, Milpitas, CA (US); Chaitanya A. Prasad, Bangalore (IN); Sairaju Tallavarjula, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 50 days.

(21) Appl. No.: 15/937,076

(22) Filed: Mar. 27, 2018

(65) Prior Publication Data

US 2018/0347045 A1    Dec. 6, 2018

Related U.S. Application Data

(60) Provisional application No. 62/513,200, filed on May 31, 2017.

(51) Int. Cl.
*H01J 37/32* (2006.01)
*C23C 16/455* (2006.01)
(Continued)

(52) U.S. Cl.
CPC .. *H01J 37/32357* (2013.01); *C23C 16/45587* (2013.01); *C30B 25/14* (2013.01);
(Continued)

(58) Field of Classification Search
CPC .. H01J 37/32; H01J 37/32477; H01J 37/3244; H01J 37/32486; H01J 37/32495;
(Continued)

(56) References Cited

U.S. PATENT DOCUMENTS 5,620,523 A * 4/1997 Maeda ............... H01J 37/3211
                                                     118/715
5,935,334 A * 8/1999 Fong ................ H01J 37/32192
                                                     118/723 ME
(Continued)

FOREIGN PATENT DOCUMENTS

CN    103189957 A    7/2013
JP    H07029827 A    1/1995
(Continued)

OTHER PUBLICATIONS

PCT Notification of Transmittal of the International Search Report and the Written Opinion of the International Searching Authority for International Application No. PCT/US2018/024539; dated Jul. 13, 2018; 11 total pages.

(Continued)

*Primary Examiner* — Gordon Baldwin
*Assistant Examiner* — Kurt Sweely
(74) *Attorney, Agent, or Firm* — Patterson + Sheridan, LLP

(57) ABSTRACT

Embodiments of the present disclosure generally relate to a process chamber for conformal oxidation of high aspect ratio structures. The process chamber includes a liner assembly located in a first side of a chamber body and two pumping ports located in a substrate support portion adjacent a second side of the chamber body opposite the first side. The liner assembly includes a flow divider to direct fluid flow away from a center of a substrate disposed in a processing region of the process chamber. The liner assembly may be fabricated from quartz minimize interaction with process gases, such as radicals. The liner assembly is designed to reduce flow constriction of the radicals, leading to increased radical concentration and flux. The two pumping ports can be individually controlled to tune the flow of (Continued)

the radicals through the processing region of the process chamber.

20 Claims, 11 Drawing Sheets

(51) Int. Cl.
    *C30B 25/14*     (2006.01)
    *H01L 21/67*     (2006.01)

(52) U.S. Cl.
    CPC .... *H01J 37/3244* (2013.01); *H01J 37/32467* (2013.01); *H01J 37/32477* (2013.01); *H01J 37/32183* (2013.01); *H01L 21/67115* (2013.01)

(58) Field of Classification Search
    CPC ........... H01J 37/32513; H01J 37/32889; H01J 37/32357; H01J 37/32449; H01J 37/32467; H01J 37/32183; H01L 21/6719; H01L 21/67098; H01L 21/67115; C23C 14/0026; C23C 16/455; C23C 16/45587; C23C 16/50; C23C 16/4404; C23C 16/4412; C23C 16/45502; C23C 16/45504; C23C 16/45508; C23C 16/45506; C23C 16/45559; C23C 16/45561; C23C 16/45563; C23C 16/45578; C23C 16/45582; C23C 16/45591; C23C 16/4409; C23C 16/452; C23C 16/45568; C23C 16/4558; C23C 16/45585; C30B 25/08; C30B 25/10; C30B 25/105; C30B 25/14; C30B 25/16; C30B 25/165

See application file for complete search history.

(56) References Cited

U.S. PATENT DOCUMENTS

| | | | | |
|---|---|---|---|---|
| 6,450,116 B1* | 9/2002 | Noble | ....................... | C23C 8/36 118/50.1 |
| 7,712,435 B2* | 5/2010 | Yoshizaki | ......... | H01J 37/32559 118/723 E |
| 8,067,061 B2* | 11/2011 | Aggarwal | ........... | C23C 16/4412 118/715 |
| 2002/0072244 A1 | 6/2002 | Agarwal | | |
| 2002/0073925 A1 | 6/2002 | Noble et al. | | |
| 2003/0040199 A1 | 2/2003 | Agarwal | | |
| 2003/0091835 A1* | 5/2003 | Takahashi | ........... | C04B 41/4527 428/432 |
| 2005/0221618 A1* | 10/2005 | AmRhein | ............. | C23C 16/452 438/710 |
| 2007/0051471 A1* | 3/2007 | Kawaguchi | ........... | H01J 37/321 156/345.36 |
| 2009/0110826 A1 | 4/2009 | Aggarwal et al. | | |
| 2013/0001196 A1 | 1/2013 | Hoffman et al. | | |
| 2013/0168377 A1* | 7/2013 | Liang | ................ | H01L 21/67017 219/385 |
| 2013/0248358 A1 | 9/2013 | Weichart | | |
| 2016/0307739 A1 | 10/2016 | Lee et al. | | |

FOREIGN PATENT DOCUMENTS

| | | |
|---|---|---|
| JP | 2001118799 A | 4/2001 |
| JP | 2002151486 A | 5/2002 |
| JP | 2002217187 A | 8/2002 |
| JP | 2004091848 A | 3/2004 |
| JP | 2007157885 A | 6/2007 |
| JP | 2008091938 A | 4/2008 |
| JP | 2012089863 A | 5/2012 |
| KR | 10-2016-0122497 A | 10/2016 |
| KR | 10-2016-0125053 A | 10/2016 |
| TW | 512457 B | 12/2002 |
| WO | 2013051248 A1 | 4/2013 |

OTHER PUBLICATIONS

Chinese Office Action dated Nov. 5, 2021 for Application No. 201880029034.X.
Japanese Office Action dated Mar. 29, 2022 for Application No. 2019-564957.
Taiwan Office Action dated Jan. 5, 2022, for Taiwan Patent Application No. 107111093.
Taiwan Office Action dated Apr. 8, 2022 for Application No. 107111093.
Korean Office Action dated Jul. 12, 2022 for Application No. 10-2019-7038362.

* cited by examiner

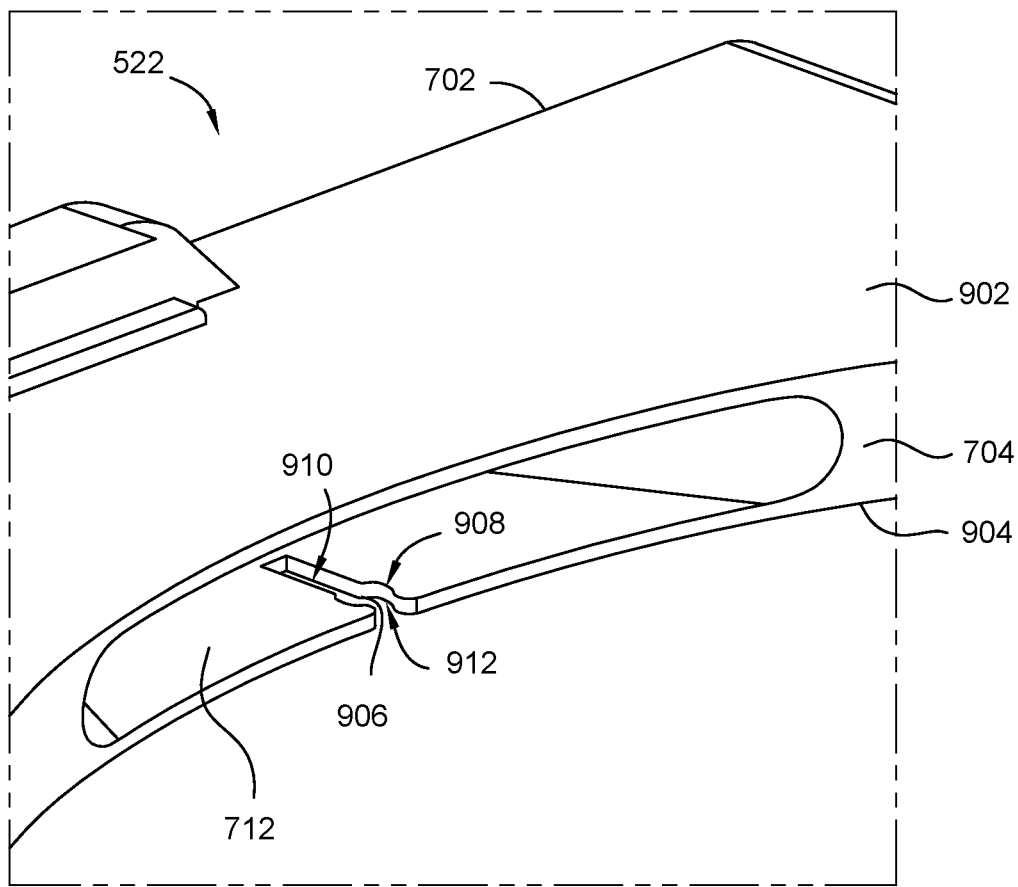
*Fig. 9A*
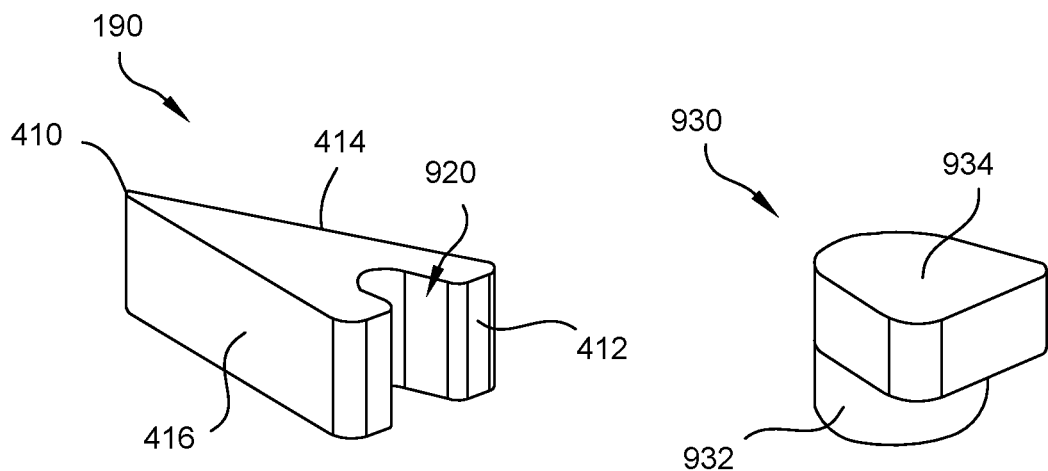
*Fig. 9B*  *Fig. 9C*

REMOTE PLASMA OXIDATION CHAMBER

CROSS-REFERENCE TO RELATED APPLICATIONS

This application claims benefit of U.S. Provisional Patent Application, Ser. No. 62/513,200, filed May 31, 2017, which is incorporated herein by reference.

BACKGROUND

Embodiments of the present disclosure generally relate to semiconductor device fabrication, and in particular to a process chamber for conformal oxidation of high aspect ratio structures.

The production of silicon integrated circuits has placed difficult demands on fabrication steps to increase the number of devices while decreasing the minimum feature sizes on a chip. These demands have extended to fabrication steps including depositing layers of different materials onto difficult topologies and etching further features within those layers. Manufacturing processes for next generation NAND flash memory involve especially challenging device geometries and scales. NAND is a type of non-volatile storage technology that does not require power to retain data. To increase memory capacity within the same physical space, a three-dimensional NAND (3D NAND) design has been developed. Such a design typically introduces alternating oxide layers and nitride layers which are deposited on a substrate and then etched to produce a structure having one or more surfaces extending substantially perpendicular to the substrate. One structure may have over 100 such layers. Such designs can include high aspect ratio (HAR) structures with aspect ratios of 30:1 or more.

HAR structures are often coated with silicon nitride ($SiN_x$) layers. Conformal oxidation of such structures to produce a uniformly thick oxide layer is challenging. New fabrication steps are required to conformally deposit layers on HAR structures, rather than simply filling gaps and trenches.

Therefore, an improved process chamber is needed.

SUMMARY

Embodiments of the present disclosure generally relate to semiconductor device fabrication, and in particular to a process chamber for conformal oxidation of high aspect ratio structures. In one embodiment, a liner member for a semiconductor processing chamber includes a first end, a second end opposite the first end, and a channel formed in a surface of the liner member and extending from the first end to the second end. The channel is wider at the second end than at the first end and shallower at the second end than at the first end.

In another embodiment, a liner assembly includes a body having a first end, a second end opposite the first end, and a conduit formed through the body and extending from the first end to the second end. The conduit defines a fluid flow path, and the conduit expands in a first direction substantially perpendicular to the fluid flow path and narrows in a second direction substantially perpendicular to the fluid flow path and the first direction.

In another embodiment, a process system includes a process chamber including a substrate support portion and a chamber body coupled to the substrate support portion. The chamber body includes a first side and a second side opposite the first side. The process chamber further includes a liner assembly disposed in the first side, and the liner assembly includes a flow divider. The process chamber further includes a distributed pumping structure located in the substrate support portion adjacent to the second side, and a remote plasma source coupled to the process chamber by a connector, wherein the connector is connected to the liner assembly to form a fluid flow path from the remote plasma source to the processing volume.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIG. 9A is a perspective view of a liner according to embodiments described herein.

FIG. 9B is a perspective view of the flow divider according to embodiments described herein.

FIG. 9C is a perspective view of a securing device according to embodiments described herein.

FIG. 10 is a perspective view of the flow divider secured in the liner by the securing device according to embodiments described herein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to a process chamber for conformal oxidation of high aspect ratio structures. The process chamber includes a liner assembly located in a first side of a chamber body and two pumping ports located in a substrate support portion adjacent a second side of the chamber body opposite the first side. The liner assembly includes a flow divider to direct fluid flow away from a center of a substrate disposed in a processing region of the process chamber. The liner assembly may be fabricated from quartz to minimize interaction with process gases, such as radicals. The liner assembly is designed to reduce flow constriction of the radicals, leading to increased radical concentration and flux. The two pumping ports can be individually controlled to tune the flow of the radicals through the processing region of the process chamber.

Figure 1A:
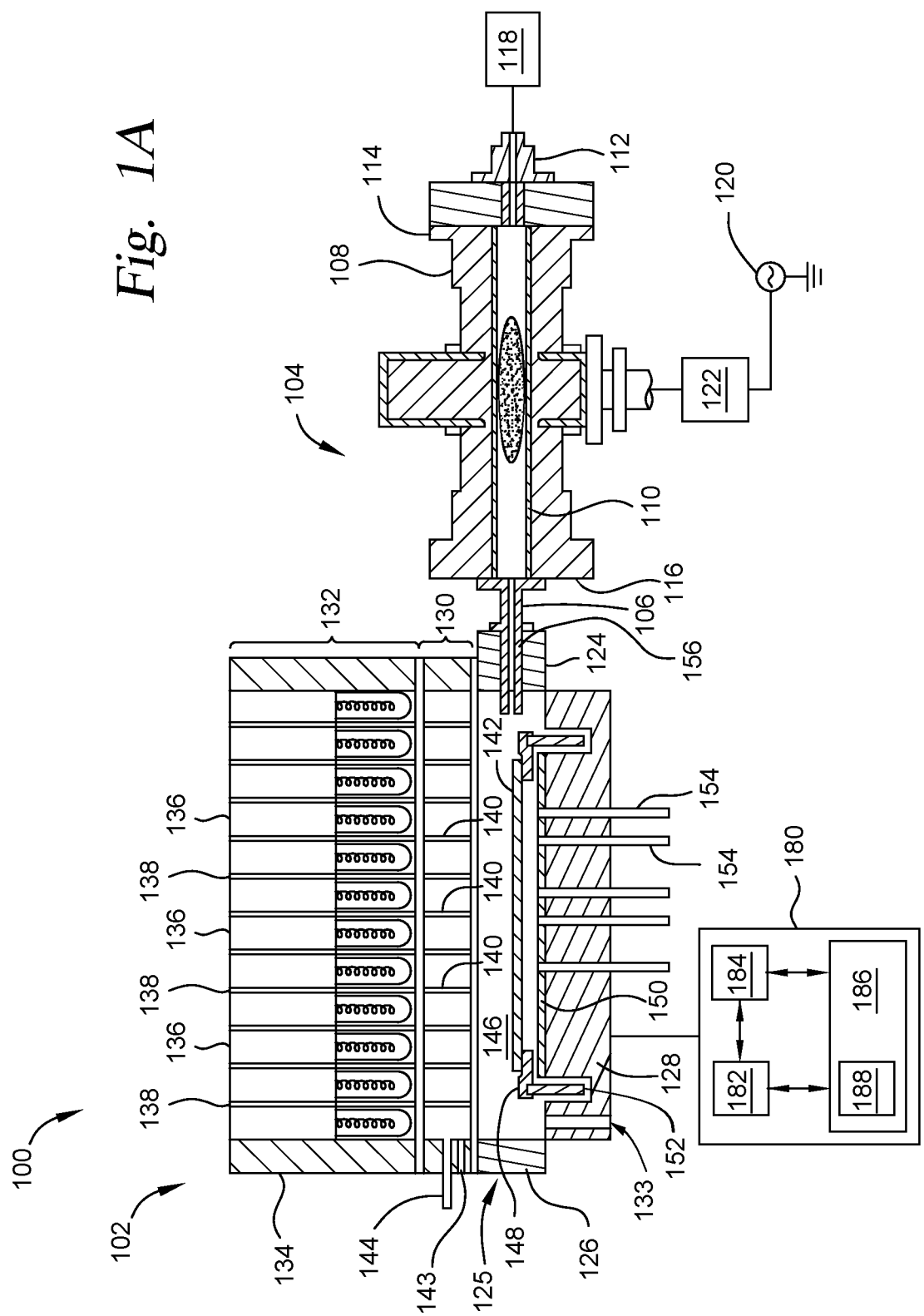
FIG. 1A is a cross-sectional view of a process system according to embodiments described herein.

FIG. 1A is a cross-sectional view of a process system 100 according to embodiments described herein. The process system 100 includes a process chamber 102 and a remote plasma source 104. The process chamber 102 may be a rapid thermal processing (RTP) chamber. The remote plasma source 104 may be any suitable remote plasma source, such as microwave coupled plasma source, that can operate at a power, for example, of about 6 kW. The remote plasma source 104 is coupled to the process chamber 102 to flow plasma formed in the remote plasma source 104 toward the process chamber 102. The remote plasma source 104 is coupled to the process chamber 102 via a connector 106. The components of the connector 106 are omitted in FIG. 1A for clarity, and the connector 106 is described in detail in connection with FIG. 3. Radicals formed in the remote plasma source 104 flow through the connector 106 into the process chamber 102 during processing of a substrate.

The remote plasma source 104 includes a body 108 surrounding a tube 110 in which plasma is generated. The tube 110 may be fabricated from quartz or sapphire. The body 108 includes a first end 114 coupled to an inlet 112, and one or more gas sources 118 may be coupled to the inlet 112 for introducing one or more gases into the remote plasma source 104. In one embodiment, the one or more gas sources 118 include an oxygen containing gas source, and the one or more gases include an oxygen containing gas. The body 108 includes a second end 116 opposite the first end 114, and the second end 116 is coupled to the connector 106. A coupling liner (not shown) may be disposed within the body 108 at the second end 116. The coupling liner is described in detail in connection with FIG. 3. A power source 120 (e.g., an RF power source) may be coupled to the remote plasma source 104 via a match network 122 to provide power to the remote plasma source 104 to facilitate the forming of the plasma. The radicals in the plasma are flowed to the process chamber 102 via the connector 106.

The process chamber 102 includes a chamber body 125, a substrate support portion 128, and a window assembly 130. The chamber body 125 includes a first side 124 and a second side 126 opposite the first side 124. In some embodiments, a lamp assembly 132 enclosed by an upper side wall 134 is positioned over and coupled to the window assembly 130. The lamp assembly 132 may include a plurality of lamps 136 and a plurality of tubes 138, and each lamp 136 may be disposed in a corresponding tube 138. The window assembly 130 may include a plurality of light pipes 140, and each light pipe 140 may be aligned with a corresponding tube 138 so the thermal energy produced by the plurality of lamps 136 can reach a substrate disposed in the process chamber 102. In some embodiments, a vacuum condition can be produced in the plurality of light pipes 140 by applying a vacuum to an exhaust 144 fluidly coupled to the plurality of light pipes 140. The window assembly 130 may have a conduit 143 formed therein for circulating a cooling fluid through the window assembly 130.

A processing region 146 may be defined by the chamber body 125, the substrate support portion 128, and the window assembly 130. A substrate 142 is disposed in the processing region 146 and is supported by a support ring 148 above a reflector plate 150. The support ring 148 may be mounted on a rotatable cylinder 152 to facilitate rotating of the substrate 142. The cylinder 152 may be levitated and rotated by a magnetic levitation system (not shown). The reflector plate 150 reflects energy to a backside of the substrate 142 to facilitate uniform heating of the substrate 142 and promote energy efficiency of the process system 100. A plurality of fiber optic probes 154 may be disposed through the substrate support portion 128 and the reflector plate 150 to facilitate monitoring a temperature of the substrate 142.

A liner assembly 156 is disposed in the first side 124 of the chamber body 125 for radicals to flow from the remote plasma source 104 to the processing region 146 of the process chamber 102. The liner assembly 156 may be fabricated from a material that is oxidation resistant, such as quartz, in order to reduce interaction with process gases, such as oxygen radicals. The liner assembly 156 is designed to reduce flow constriction of radical flowing to the process chamber 102. The liner assembly 156 is described in detail below. The process chamber 102 further includes a distributed pumping structure 133 formed in the substrate support portion 128 adjacent to the second side 126 of the chamber body 125 to tune the flow of radicals from the liner assembly 156 to the pumping ports. The distributed pumping structure 133 is located adjacent to the second side 126 of the chamber body 125. The distributed pumping structure 133 is described in detail in connection with FIG. 10.

A controller 180 may be coupled to various components of the process system 100, such as the process chamber 102 and/or the remote plasma source 104 to control the operation thereof. The controller 180 generally includes a central processing unit (CPU) 182, a memory 186, and support circuits 184 for the CPU 182. The controller 180 may control the process system 100 directly, or via other computers or controllers (not shown) associated with particular support system components. The controller 180 may be one of any form of general-purpose computer processor that can be used in an industrial setting for controlling various chambers and sub-processors. The memory 186, or computer-readable medium, may be one or more of readily available memory such as random access memory (RAM), read only memory (ROM), floppy disk, hard disk, flash drive, or any other form of digital storage, local or remote. The support circuits 184 are coupled to the CPU 182 for supporting the processor in a conventional manner. The support circuits 184 include cache, power supplies, clock circuits, input/output circuitry and subsystems, and the like. Processing steps may be stored in the memory 186 as software routine 188 that may be executed or invoked to turn the controller 180 into a specific purpose controller to control the operations of the process system 100. The controller 180 may be configured to perform any methods described herein.

Figure 1B:
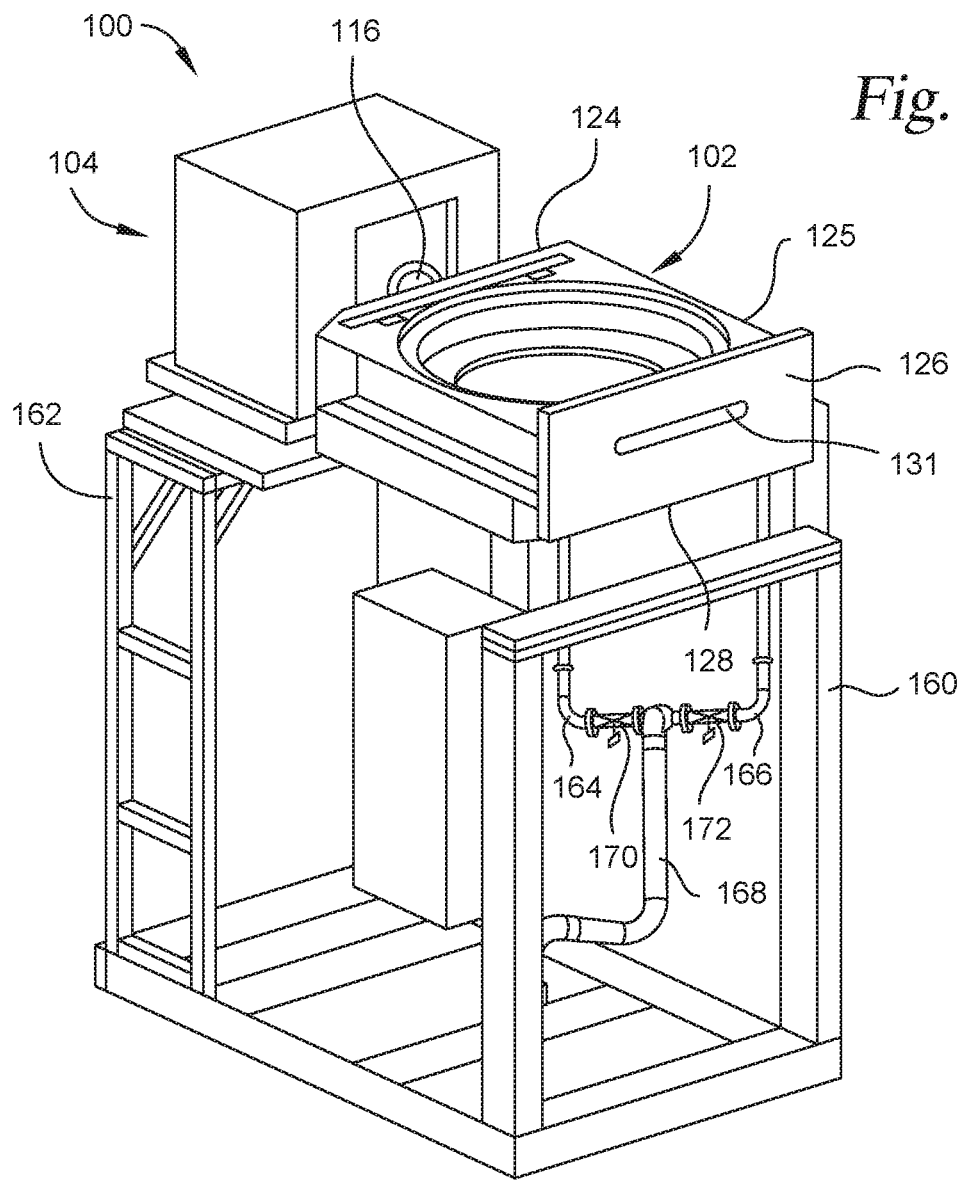
FIG. 1B is a perspective view of the process system according to embodiments described herein.

FIG. 1B is a perspective view of the process system 100 according to embodiments described herein. As shown in FIG. 1B, the process chamber 102 includes the chamber body 125 having the first side 124 and the second side 126 opposite the first side 124. A slit valve opening 131 is formed in the second side 126 of the chamber body 125 for allowing the substrate 142 to enter and exit the process chamber 102. The process system 100 is shown in FIG. 1B with the window assembly 130 and the lamp assembly 132 removed for clarity. The process chamber 102 may be supported by a support 160 and the remote plasma source 104 may be supported by a support 162. A first conduit 164 is coupled to one of the two pumping ports (not visible in FIG. 1B) and a valve 170 may be disposed in the first conduit 164 to control the flow of radicals within the process chamber 102. A second conduit 166 is coupled to the other pumping port (not visible in FIG. 1B) of the two pumping ports and a valve 172 may be disposed in the second conduit 166 to control the flow of radicals within the process chamber 102. The first and second conduits 164, 166 may be connected to a third conduit 168, which may be connected to a vacuum pump (not shown).

Figure 1C:
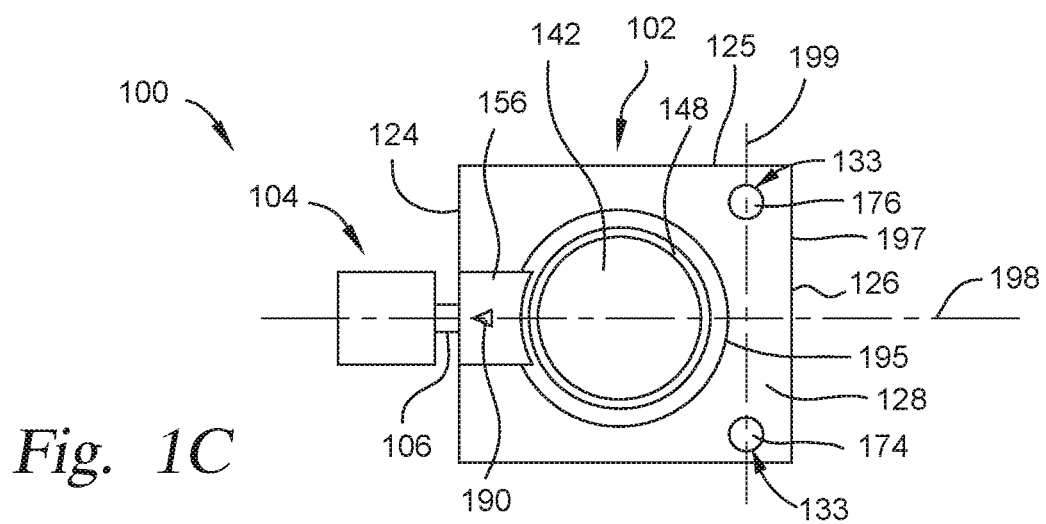

FIG. 1C is a schematic top view of the process system 100 according to embodiments described herein. As shown in FIG. 1C, the process system 100 includes the remote plasma source 104 coupled to the process chamber 102 via the connector 106. The process system 100 is shown in FIG. 1C with the window assembly 130 and the lamp assembly 132 removed for clarity. The process chamber 102 includes the chamber body 125 having the first side 124 and the second side 126. The chamber body 125 may include an interior edge 195 and an exterior edge 197. The exterior edge 197 may include the first side 124 and the second side 126. The interior edge 195 may have a shape similar to the shape of a substrate being processed in the process chamber 102. In one embodiment, the interior edge 195 of the chamber body 125 is circular. The exterior edge 197 may be rectangular, as shown in FIG. 1C, or other suitable shape. In one embodiment, the chamber body 125 is a base ring. The liner assembly 156 is disposed in the first side 124 of the chamber body 125. The liner assembly 156 includes a flow divider 190 to deflect fluid flow from a center of the substrate 142. Without the flow divider 190, the oxide layer formed on the substrate 142 has a non-uniform thickness, such that the oxide layer at the center of the substrate can be up to 40 percent thicker than the oxide layer at the edge of the substrate. By utilizing the flow divider 190, the oxide layer formed on the substrate can have a thickness uniformity of five percent of less.

The process chamber 102 includes a distributed pumping structure 133 having a two or more pumping ports (FIG. 1A). The two or more pumping ports are connected to one or more vacuum sources and independently flow controlled. In one embodiment, as shown in FIG. 1C, two pumping ports 174, 176 are formed in the substrate support portion 128 adjacent to the second side 126 of the chamber body 125. The two pumping ports 174, 176 are spaced apart and can be controlled independently. The pumping port 174 may be connected to the conduit 164 (FIG. 1B), and the pumping from the pumping port 174 can be controlled by the valve 170. The pumping port 176 may be connected to the conduit 166 (FIG. 1B), and the pumping from the pumping port 176 can be controlled by the valve 172. The oxide layer thickness uniformity can be further improved by individually controlling pumping from each pumping port 174, 176. Fluid, such as oxygen radicals, flowing through the process chamber 102 from the first side 124 to the second side 126 may be increased by opening valve 172 and/or valve 170. Increased fluid flowing through the process chamber 102 can increase fluid density, such as oxygen radical density, leading to faster deposition on the substrate 142. Because the pumping port 174 and the pumping port 176 are spaced apart and controlled independently, fluid flowing across different portions of the substrate 142 can be increased or decreased, leading to faster or slower deposition on different portions of the substrate 142 to compensate for thickness non-uniformity of the oxide layer at different portions of the substrate 142.

In one embodiment, the two pumping ports 174, 176 are disposed spaced apart along a line 199 perpendicular to a gas flow path at the first side 124 of the chamber body 125. The line 199 may be adjacent to the second side 126 of the chamber body 125, and the line 199 may be outside of the substrate support ring 148, as shown in FIG. 1C. In some embodiments, the line 199 may intersect a portion of the substrate support ring 148. In some embodiments, the line 199 is not perpendicular to the gas flow path, and the line 199 may form an acute or obtuse angle with respect to the gas flow path. The pumping ports 174, 176 may be disposed symmetrically or asymmetrically in the substrate support portion 128 with respect to a central axis 198 of the process chamber 102, as shown in FIG. 1C. In some embodiments, more than two pumping ports are formed in the substrate support portion 128.

Figure 2A:
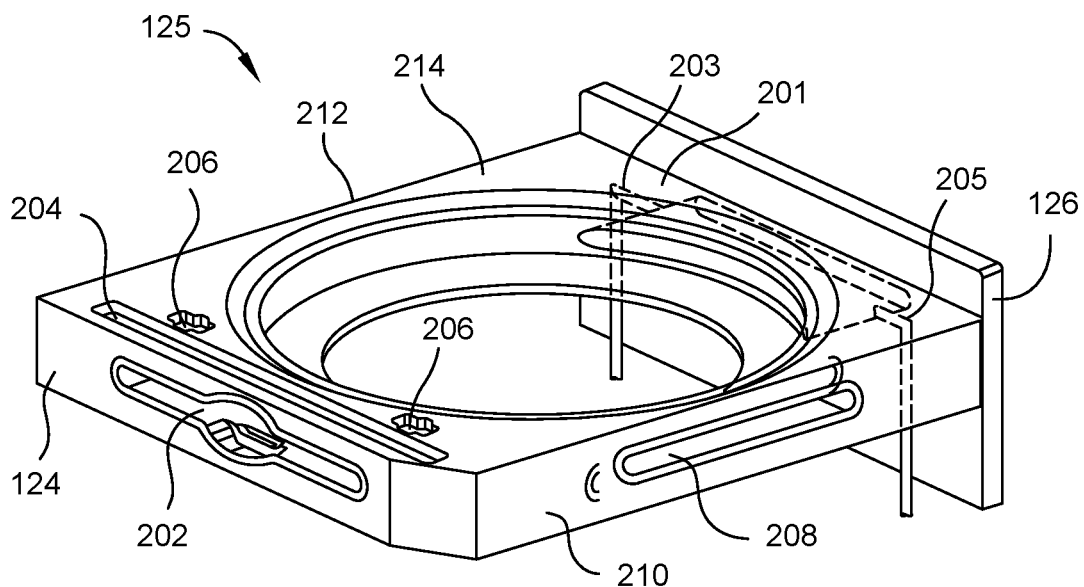
FIG. 2A is a perspective view of a chamber body according to embodiments described herein.

FIG. 2A is a perspective view of the chamber body 125 according to embodiments described herein. As shown in FIG. 2A, the chamber body 125 includes the first side 124, the second side 126 opposite the first side 124, a third side 210 between the first side 124 and the second side 126, and a fourth side 212 opposite the third side 210. A slot 202 is formed in the first side 124, and the liner assembly 156 (FIG. 1A) is disposed in the slot 202. An opening 208 is formed in the third side 210 for various sensors to monitor process conditions. A substrate tunnel 201 is formed in the chamber body 125, and the substrate tunnel 201 is connected to the slit valve opening 131 (FIG. 1B). The substrate tunnel 201 is connected to a first gas passage 203 and a second gas passage 205. The first gas passage 203 and the second gas passage 205 are connected to the distributed pumping structure 133 (FIG. 1C). In one embodiment, the first gas passage 203 and the second gas passage 205 extend from opposite sides of the substrate tunnel 201, and the first gas passage 203 and the second gas passage 205 are arranged along an axis that is substantially perpendicular to a gas flow path from the first side 124 to the second side 126 of the chamber body 125. In one embodiment, each of the first gas passage 203 and the second gas passage 205 includes a channel formed in the chamber body 125 and a conduit extending towards the substrate support portion 128. In one embodiment, the first gas passage 203 is connected to the pumping port 176, and the second gas passage 205 is connected to the pumping port 174. In one embodiment, the gas passage 203 is connected to the conduit 166 (FIG. 1B), and the gas passage 205 is connected to the conduit 164 (FIG. 1B). The chamber body 125 has a top surface 214, and a slot 204 may be formed in the top surface 214. The slot 204 may be utilized to introduce one or more gases into the process chamber 102. One or more openings 206 may be formed in the top surface 214 for one or more fastening devices (not shown) to secure the liner assembly 156 (FIG. 1A) to the chamber body 125.

Figure 2B:
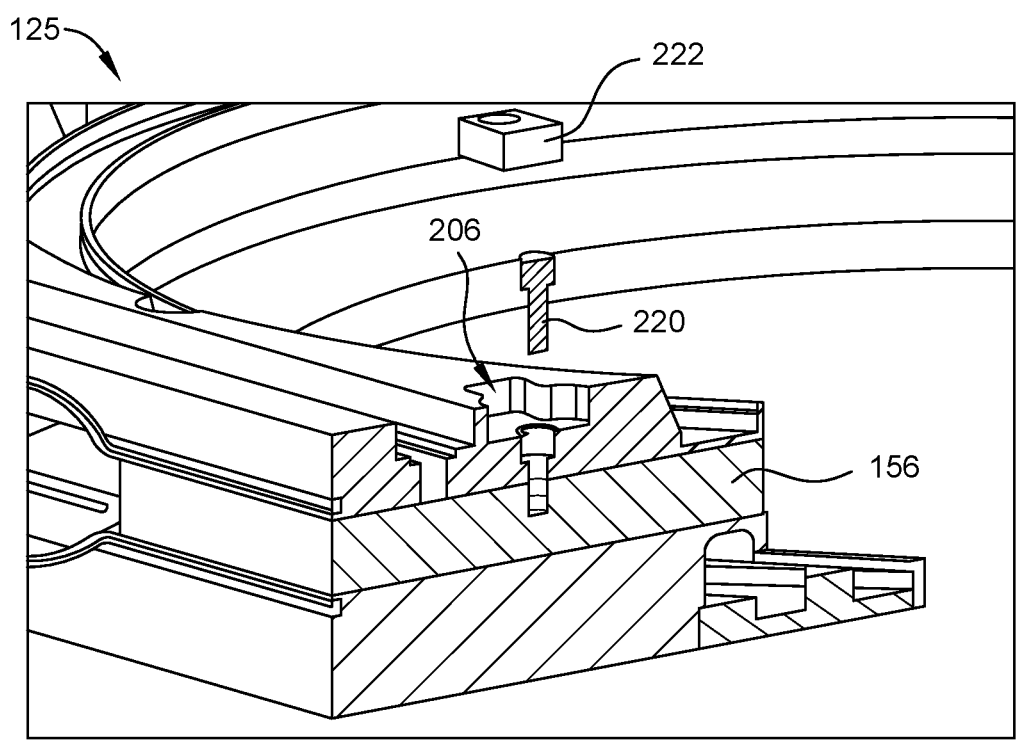
FIG. 2B is a cross-sectional perspective view of a portion of the chamber body including a liner assembly according to embodiments described herein.

FIG. 2B is a cross-sectional perspective view of a portion of the chamber body 125 including the liner assembly 156. As shown in FIG. 2B, the liner assembly 156 is located in the chamber body 125, and a fastening device 220 secures the liner assembly 156 to the chamber body 125 through one of the one or more openings 206. In one embodiment, the fastening device 220 is a screw. A fastening device cover 222 may be disposed in the opening 206 to cover the fastening device 220.

Figure 3:
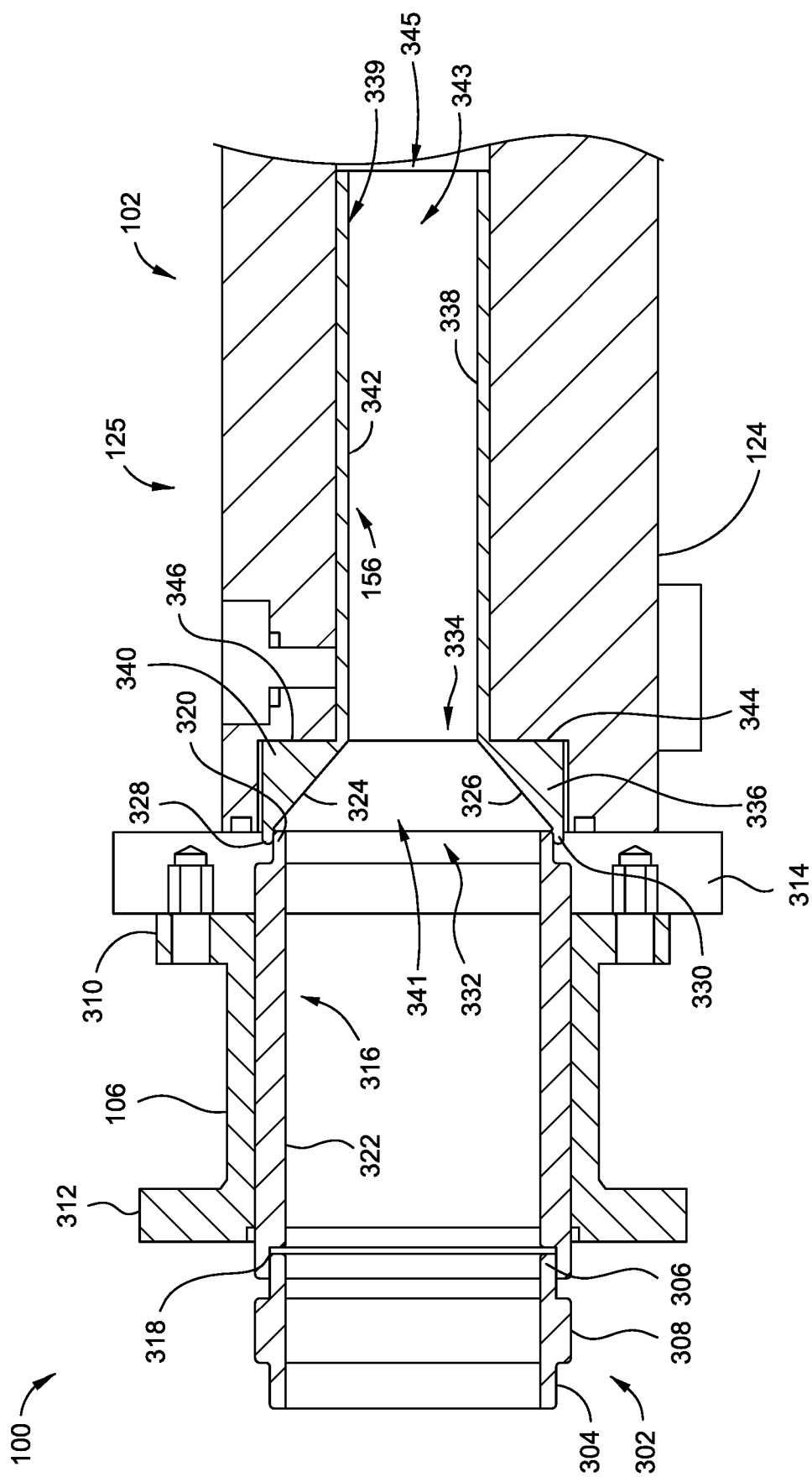
FIG. 3 is a cross-sectional view of a portion of the process system of FIGS. 1A-10 according to embodiments described herein.

FIG. 3 is a cross-sectional view of a portion of the process system 100 of FIGS. 1A-10. As shown in FIG. 3, the process system 100 includes the connector 106 coupled to the first side 124 of the chamber body 125 of the process chamber 102 via a connector plate 314. The connector 106 may include a first flange 310 coupled to the connector plate 314 and a second flange 312 coupled to the remote plasma source 104 (FIG. 1A). The connector 106 may be fabricated from a metal, such as stainless steel. A liner 316 may be located within the connector 106, and the liner 316 may be fabricated from a material that is oxidation resistant, such as quartz. The liner 316 may be cylindrical and may include a first end 318, a second end 320 opposite the first end 318, and a center portion 322 between the first end 318 and the second end 320. In some embodiments, the liner 316 is not cylindrical and the liner 316 may expand in cross-sectional area from the first end 318 to the second end 320. The first end 318 may have a wall thickness less than a wall thickness of the center portion 322. The first end 318 may have an outer diameter that is the same as an outer diameter of the center portion 322 and an inner diameter that is greater than an inner diameter of the center portion 322. The second end 320 may have a wall thickness less than the wall thickness of the center portion 322. The second end 320 may have an outer diameter that is less than the outer diameter of the center portion 322 and an inner diameter that is the same as the inner diameter of the center portion 322. The liner 316 may be fabricated by machining a solid piece of quartz or by 3D printing.

A coupling liner 302 may be coupled to the liner 316, and the coupling liner 302 may be located within the remote plasma source 104 (FIG. 1A), such as inside an exit coupling of the remote plasma source 104. The coupling liner 302 may be cylindrical. The coupling liner 302 may be fabricated from a material that is oxidation resistant, such as quartz. The coupling liner 302 may include a first end 304, a second end 306 opposite the first end 304, and a center portion 308 between the first end 304 and the second end 306. The first end 304 has a wall thickness less than a wall thickness of the center portion 308. The first end 304 has an outer diameter that is less than an outer diameter of the center portion 308 and an inner diameter that is the same as an inner diameter of the center portion 308. The second end 306 has a wall thickness less than the wall thickness of the center portion 308. The second end 304 has an outer diameter that is less than the outer diameter of the center portion 308 and an inner diameter that is the same as the inner diameter of the center portion 308. The second end 306 of the coupling liner 302 may be coupled to the first end 318 of the liner 316, and the first end 318 of the liner 316 may surround the second end 306 of the coupling liner 302. The second end 306 of the coupling liner 302 may be coupled to the first end 318 of the liner 316 in any suitable fashion. In one embodiment, the outer diameter of the second end 306 of the coupling liner 302 may be slightly smaller than the inner diameter of the first end 318 of the liner 316, so the second end 306 of the coupling liner 302 can fit securely in the first end 318 of the liner 316. In another embodiment, the inner diameter of the second end 306 of the coupling liner 302 may be slightly larger than the outer diameter of the first end 318 of the liner 316, so the first end 318 of the liner 316 can fit securely in the second end 306 of the coupling liner 302. In another embodiment, the wall thickness of the second end 306 of the coupling liner 302 is the same as the wall thickness of the first end 318 of the liner 316. One of the first end 318 and the second end 306 include a protrusion formed thereon while the other of the first end 318 and the second end 306 include a recess formed therein, and the protrusion on one of the first end 318 and the second end 306 is inside the recess in the other of the first end 318 and the second end 306 as the first end 318 is coupled to the second end 306. The protrusion may be one or more discrete protrusions or a continuous protrusion formed on one of the first end 318 and the second end 306, and the recess may be one or more corresponding recesses or a continuous recess formed on the other of the first end 318 and the second end 306. In another embodiment, the first end 318 and the second end 306 may include alternating sections that are overlapping when coupled together. The coupling liner 302 may be fabricated by machining a solid piece of quartz or by 3D printing.

The liner assembly 156 may include an upper liner 324 and a lower liner 326. The upper liner 324 and the lower liner 326 may be both fabricated from a material that is oxidation resistant, such as quartz. Each of the upper liner 324 and the lower liner 326 may be fabricated by machining a solid piece of quartz or by 3D printing. The lower liner 326 includes a first portion 336 and a second portion 338. The first portion 336 may be located within the slot 202 (FIG. 2) and may be pushed against a step 344 in the slot 202. In this configuration, the lower liner 326 is prevented from sliding into the processing region 146 (FIG. 1A) of the process chamber 102. The upper liner 324 is disposed on the lower liner 326. The upper liner 324 includes a first portion 340 and a second portion 342. The first portion 340 may be located within the slot 202 and may be pushed against a step 346 in the slot 202. In this configuration, the upper liner 324 is prevented from sliding into the processing region 146 of the process chamber 102. The first portion 336 of the lower liner 326 includes an end 330, and the first portion 340 of the upper liner 324 includes an end 328. The end 330 and the end 328 may form an opening 332 and may surround the second end 320 of the liner 316. In one embodiment, the opening 332 formed by the end 330 and the end 328 has a circular cross section, and the second end 320 of the liner 316 is cylindrical. The outer diameter of the second end 320 of the liner 316 may be slightly smaller than the opening 332 formed by the end 330 and the end 328, so the second end 320 of the liner 316 can fit securely in the opening 332 formed by the end 330 and the end 328. The second end 320 of the liner 316 may be coupled to the end 330 and the end 328 in any suitable fashion. In one embodiment, the second end 320 of the liner 316 is coupled to the end 330 and the end 328 in the same fashion as the second end 306 of the coupling liner 302 coupled to the first end 318 of the liner 316.

The first portion 336 of the lower liner 326 and the first portion 340 of the upper liner 324 may form another opening 334 recessed from the opening 332 in the slot 202. In one embodiment, the opening 334 has a race track shape. The opening 334 has a cross-sectional area that is substantially the same as or greater than the cross-sectional area of the opening 332. The lower liner 326 and the upper liner 324 cooperatively define the fluid flow path. The liner assembly 156 includes a body 339. In one embodiment, the body 339 includes the lower liner 326 and the upper liner 324. A conduit 343 is formed through the body 339 of the liner assembly 156 extending from a first end 341 of the body 339 to a second end 345 of the body 339. The conduit 343 expands in a first direction substantially perpendicular to the fluid flow path and narrows in a second direction substantially perpendicular to the fluid flow path and the first direction. During operation, radicals formed in the remote plasma source 104 (FIG. 1A) flow through the coupling liner 302, the liner 316, and the conduit 343 of the liner assembly 156 into the processing region 146 of the process chamber 102. Because the liners 302, 316 and the liner assembly 156 are fabricated from an oxidation resistant material, such as quartz, the radicals do not recombine when contacting surfaces of the liners 302, 316 and the liner assembly 156. In addition, because the cross-sectional area of the opening 334 is the same as or greater than the cross-sectional area of the opening 332, the flow of the radicals are not constricted, leading to increased radical concentration and flux in the processing region 146.

Figure 4A:
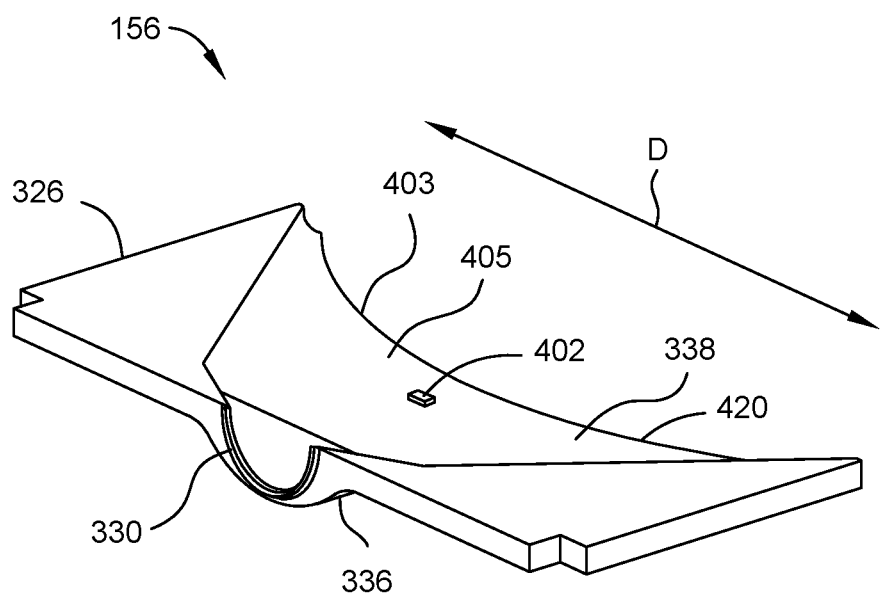
FIG. 4A is a perspective view of a lower liner of the liner assembly according to embodiments described herein.

FIG. 4A is a perspective view of the lower liner 326 of the liner assembly 156 according to embodiments described herein. As shown in FIG. 4A, the lower liner 326 includes the first end 330 and a second end 403 opposite the first end 330. In one embodiment, the end 330 may be semi-circular, as shown in FIG. 4A. The end 330 and the end 328 (FIG. 3) may form any shape that provides fluid flow without abrupt constrictions. An expanding channel 405 extends from the first end 330 to the second end 403. The second end 403 may extend beyond the first side 124 of the chamber body 125 (FIG. 1A). The second end 403 may include a portion 420 that is an arc, and the portion 420 may be substantially parallel to a portion of the support ring 148 (FIG. 1A). The expanding channel 405 may expand in a dimension D that is substantially perpendicular to a fluid flow path from the first end 330 to the second end 403. The expanding channel 405 is wider at the second end 403 than at the first end 330 and is shallower at the second end 403 than at the first end 330. The fluid may be oxygen radicals, and the expanding channel 405 further reduces flow constriction of the radicals. The expanding channel 405 may have a cross section that is curved.

Figure 4B:
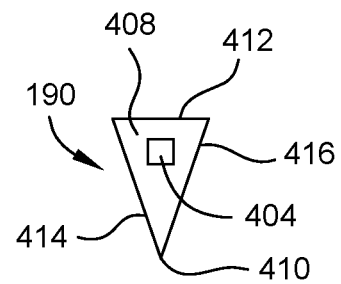
FIG. 4B is a bottom view of a flow divider according to embodiments described herein.

The lower liner 326 may include a protrusion 402 disposed in the expanding channel 405 of the second portion 338, as shown in FIG. 4A. The protrusion 402 is utilized to secure the flow divider 190 (FIG. 1C). FIG. 4B is a bottom view of the flow divider 190 according to embodiments described herein. As shown in FIG. 4B, the flow divider 190 includes a bottom surface 408 and a recess 404 formed in the bottom surface 408. The flow divider 190 is disposed on the expanding channel 405 of the second portion 338 of the lower liner 326, and the protrusion 402 formed on the expanding channel 405 fits inside of the recess 404 to secure the flow divider 190 on the lower liner 326. The flow divider 190 may have any suitable shape that can divide the flow of fluid, such as radicals. In one embodiment, as shown in FIG. 4B, the flow divider 190 has a triangular shape. In another embodiment, the flow divider 190 has an oval shape. In another embodiment, the flow divider 190 has a circular shape. The shape of the flow divider 190 is based on the top view of the flow divider 190. The flow divider 190 may have a height. In one embodiment, the flow divider 190 is a cylinder. In another embodiment, the flow divider 190 is an oval cylinder. The flow divider 190 has a first end 410 facing the first portion 336 of the lower liner 326 and a second end 412 opposite the first end 410. The first end 410 may have a width that is smaller than a width of the second end 412. In one embodiment, the first end 410 is an acute edge. The first end 410 and the second end 412 may be joined by surfaces 414, 416. In one embodiment, each of the surfaces 414, 416 is linear, as shown in FIG. 4B. In other embodiments, one or more of the surfaces 414, 416 may be curved.

Figure 4C:
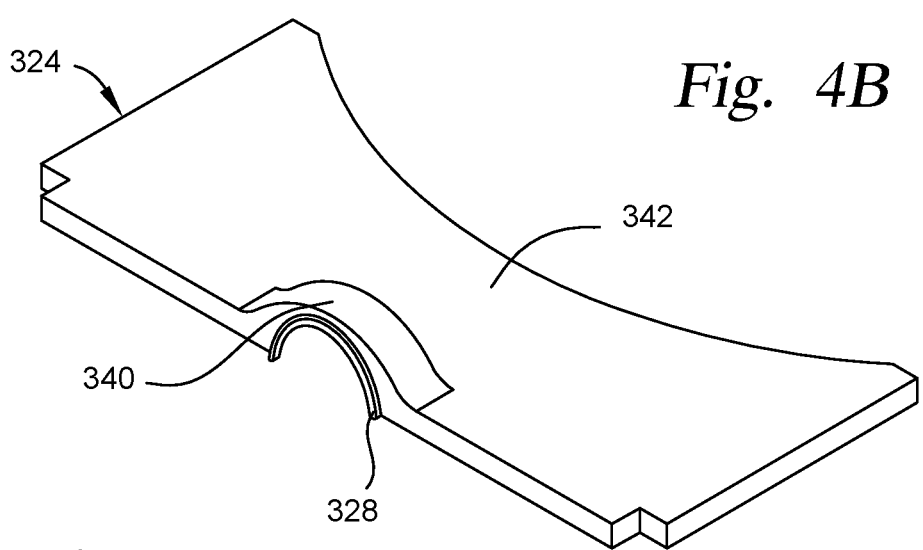
FIG. 4C is a perspective view of an upper liner of the liner assembly according to embodiments described herein.

FIG. 4C is a perspective view of the upper liner 324 of the liner assembly 156 according to embodiments described herein. As shown in FIG. 4C, the upper liner 324 includes the first portion 340 and the second portion 342. The first portion 340 includes the end 328. In one embodiment, the end 328 may be semi-circular, as shown in FIG. 4C. The end 330 (FIG. 4A) and the end 328 may form any shape that provides fluid flow without abrupt constrictions. The second portion 342 may include an expanding channel (not shown) that is similar to the expanding channel 405. In one embodiment, the upper liner 324 is identical with the lower liner 326, except that the upper liner 324 does not include the protrusion 402. The flow divider 190 can contact the upper liner 324 when placed on the lower liner 326, or a gap may be formed between the flow divider 190 and the upper liner 324 when the flow divider 190 is placed on the lower liner 326.

Figure 5:
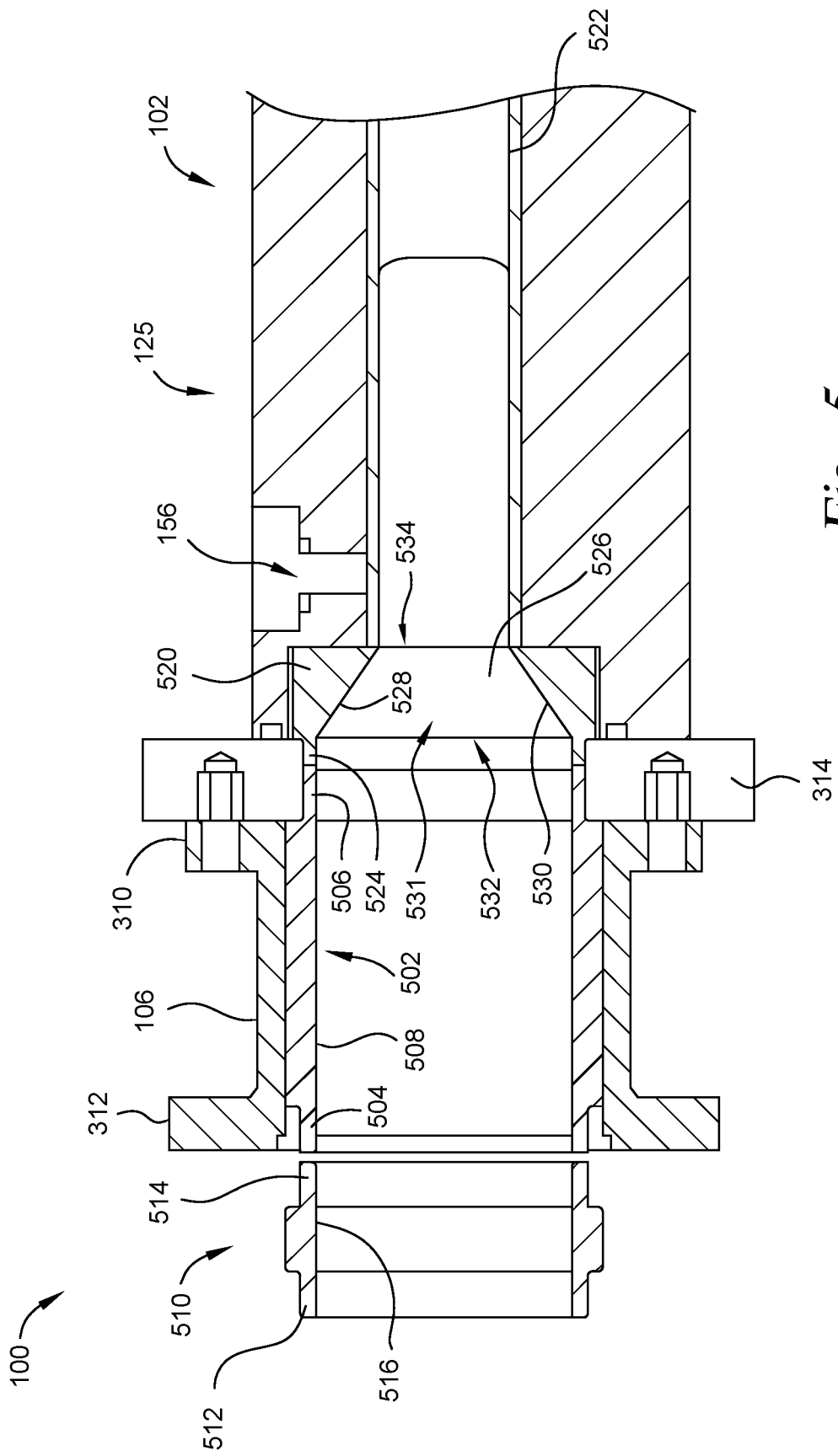
FIG. 5 is a cross-sectional side view of a portion of the process system of FIGS. 1A-1C according to embodiments described herein.

FIG. 5 is a cross-sectional view of a portion of the process system 100 of FIGS. 1A-1C according to embodiments described herein. As shown in FIG. 5, the process system 100 includes the connector 106 coupled to the first side 124 of the chamber body 125 of the process chamber 102 via the connector plate 314. The connector 106 may include the first flange 310 coupled to the connector plate 314 and the second flange 312 coupled to the remote plasma source 104 (FIG. 1A). A liner 502 may be located within the connector 106. The liner 502 is fabricated from a material that is oxidation resistant, such as quartz. The liner 502 may be cylindrical and may include a first end 504, a second end 506 opposite the first end 504, and a center portion 508 between the first end 504 and the second end 506. In some embodiments, the liner 502 is not cylindrical and the liner 502 may expand in cross-sectional area from the first end 504 to the second end 506. The first end 504 may have a wall thickness less than a wall thickness of the center portion 508. The first end 504 may have an outer diameter that is the less than an outer diameter of the center portion 508 and an inner diameter that is the same as an inner diameter of the center portion 508. The second end 506 may have a wall thickness less than the wall thickness of the center portion 508. The second end 506 may have an outer diameter that is less than the outer diameter of the center portion 508 and an inner diameter that is the same as the inner diameter of the center portion 508. The liner 502 may be fabricated by machining a solid piece of quartz or by 3D printing.

A coupling liner 510 may be coupled to the liner 502, and the coupling liner 510 may be located within the remote plasma source 104 (FIG. 1A), such as inside an exit coupling of the remote plasma source 104. The coupling liner 510 may be cylindrical. The coupling liner 510 may be fabricated from a material that is oxidation resistant, such as quartz. The coupling liner 510 may include a first end 512, a second end 514 opposite the first end 512, and a center portion 516 between the first end 512 and the second end 514. The first end 512 has a wall thickness less than a wall thickness of the center portion 516. The first end 512 has an outer diameter that is less than an outer diameter of the center portion 516 and an inner diameter that is the same as an inner diameter of the center portion 516. The second end 514 has a wall thickness less than the wall thickness of the center portion 516. The second end 514 has an outer diameter that is less than the outer diameter of the center portion 516 and an inner diameter that is the same as the inner diameter of the center portion 516. The inner and outer diameters of the second end 514 of the liner 510 may be the same as the inner and outer diameters of the first end 504 of the liner 502, respectively. The second end 514 of the coupling liner 510 may be coupled to the first end 504 of the liner 502 by an external fastening device (not shown). The coupling liner 510 may be fabricated by machining a solid piece of quartz or by 3D printing.

The liner assembly 156 may include a nozzle 520 and a liner 522 in contact with the nozzle 520. The nozzle 520 and the liner 522 are both fabricated from a material that is oxidation resistant, such as quartz. Each of the nozzle 520 and the liner 522 may be fabricated by machining a solid piece of quartz or by 3D printing. The nozzle 520 may be located in the slot 202 (FIG. 2) of the chamber body 125. The nozzle 520 includes an end 524 coupled to the second end 506 of the liner 502. The inner and outer diameters of the end 524 of the nozzle 520 may be the same as the inner and outer diameters of the second end 506 of the liner 502, respectively. The nozzle 520 may include a first opening 532 facing the liner 502 and a second opening 534 opposite the first opening 532. The first opening 532 has a shape that matches the shape of the second end 506 of the liner 502. In one embodiment, the second end 506 is cylindrical and the first opening 532 has a circular cross sectional area. The second opening 534 has a shape that matches the shape of an opening formed in the liner 522. In one embodiment, the second opening 534 has a race track shape. The second opening 534 has a cross-sectional area that is substantially the same as or greater than the cross-sectional area of the first opening 532. The first opening 532 and the second opening 534 may be connected by surfaces 526, 528, 530. The surfaces 526, 528, 530 may be a continuous curved surface that form an expanding channel 531. During operation, radicals formed in the remote plasma source 104 flow through the liner 510, the liner 502, and the liner assembly 156 into the processing region 146 of the process chamber 102. Because the liners 510, 502 and the liner assembly 156 are fabricated from quartz, the radicals do not recombine when contacting surfaces of the liners 510, 502 and the liner assembly 156. In addition, because the cross-sectional area of the second opening 534 is the same as or greater than the cross-sectional area of the first opening 532, the flow of the radicals are not constricted, leading to increased radical concentration and flux in the processing region 146. In one embodiment, the liners 510, 502 and the liner assembly 156 are used in the process system 100.

Figure 6A:
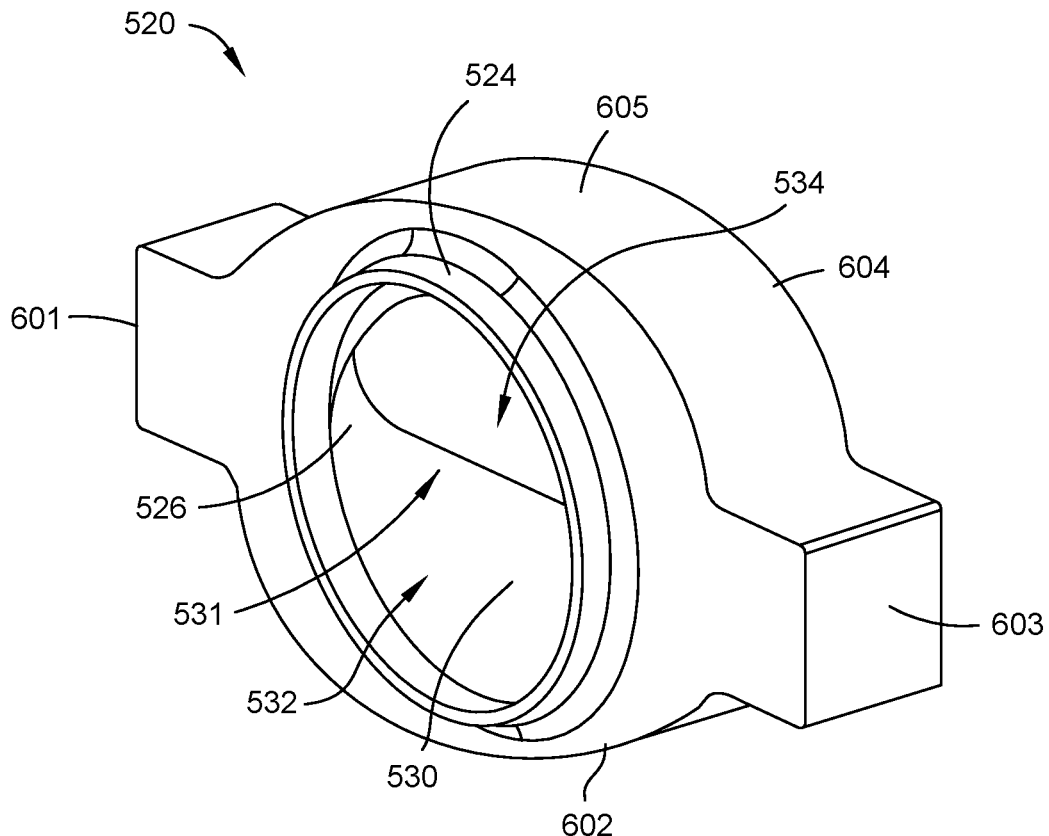
FIG. 6A is a perspective view of a nozzle according to embodiments described herein.
Figure 6B:
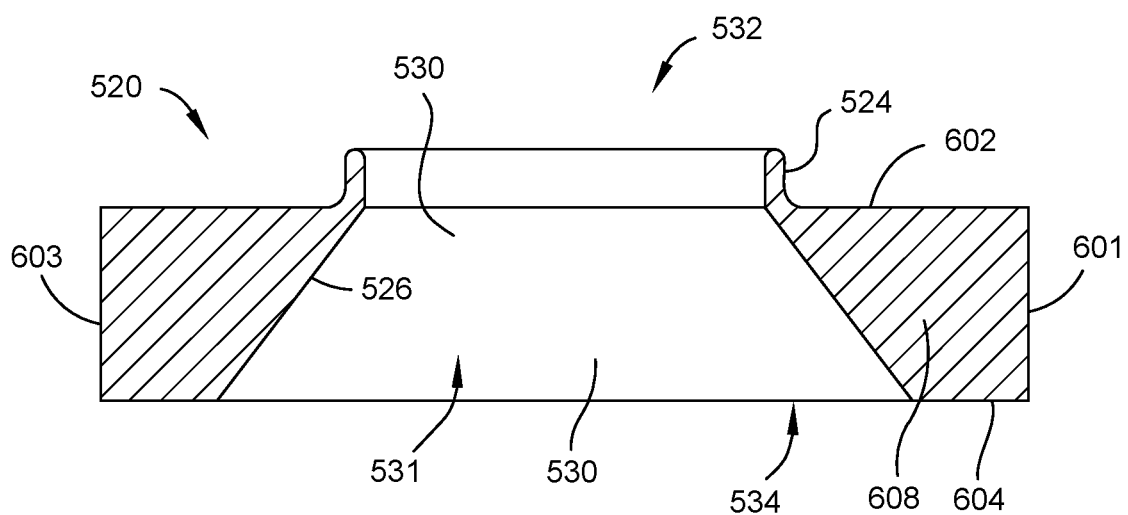
FIG. 6B is a cross-sectional view of the nozzle of claim 6A.

FIG. 6A is a perspective view of the nozzle 520 according to one embodiment described herein, and FIG. 6B is a cross-sectional view of the nozzle 520 of FIG. 6A. As shown in FIGS. 6A and 6B, the nozzle 520 includes a first surface 602 and a second surface 604 opposite the first surface 602. The first surface 602 may face the liner 502 of the connector 106 (FIG. 5) and the second surface 604 may face the liner 522 (FIG. 5). The end 524 may be located on the first surface 602. The first opening 532 is formed in the first surface 602, and the first opening 532 may have a circular shape, as shown in FIG. 6A. The second opening 534 is formed in the second surface 604, and the second opening 534 may have a race track shape. The second opening 534 may include a long dimension that is greater than the diameter of the first opening 532 and a short dimension that is less than the diameter of the first opening 532. The nozzle 520 may include a first end 601, a second end 603 opposite the first end 601, and a portion 605 located between the first end 601 and the second end 603. When viewing the first surface 602, the first and second ends 601, 603 may each have a rectangular shape, and the portion 605 may have an oval shape. The portion 605 may have a different shape than the oval shape shown in FIG. 6A.

As shown in FIGS. 5, 6A and 6B, surfaces 526, 528, 530, 608 connect the first opening 532 to the second opening 534. Surfaces 526, 528, 530, 608 facilitate the transition from the shape of the first opening 532 to the shape of the second opening 534 so the cross-sectional area of the second opening 534 is substantially the same as or greater than the cross-sectional area of the first opening 532. Surfaces 526, 528, 530, 608 may be a continuous curved surface that form the expanding channel 531. In one embodiment, the expanding channel 531 may be expanding in one dimension, such as the long dimension of the race track shape of the second opening 534, while decreasing in another dimension, such as the short dimension of the race track shape of the second opening 534. In some embodiments, surfaces 526, 528, 530, 608 may be discrete surfaces having different curvatures.

Figure 7:
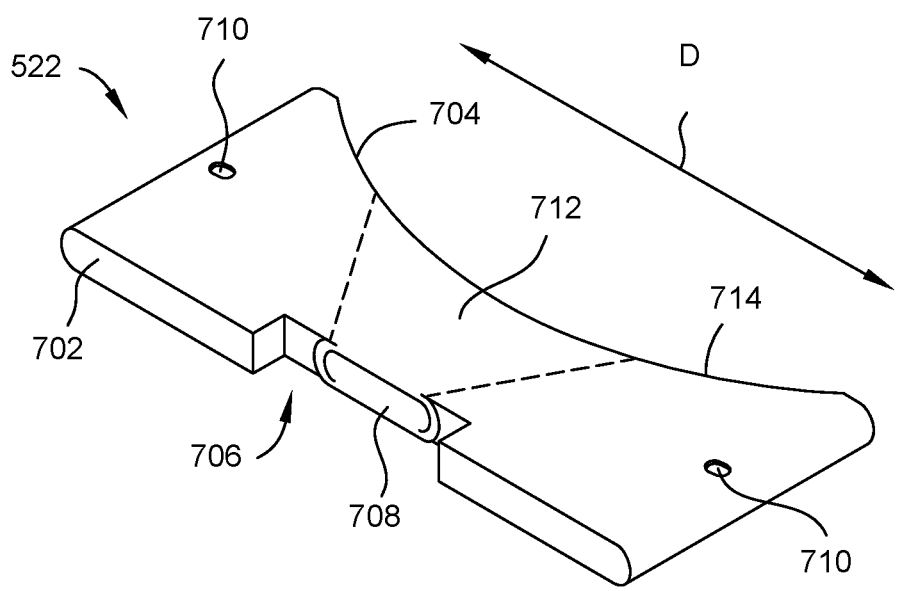
FIG. 7 is a perspective view of a liner according to embodiments described herein.

FIG. 7 is a perspective view of the liner 522 according to one embodiment described herein. As shown in FIG. 7, the liner 522 includes a first end 702 and a second end 704 opposite the first end 702. The first end 702 may face the connector 106 and the remote plasmas source 104 (FIG. 1A) and the second end 704 may face the processing region 146 of the process chamber 102 (FIG. 1A). A recess 706 may be formed in the first end 702 for the nozzle 520 to be disposed therein. An opening 708 is formed in the recess 706 to couple to the second opening 534 of the nozzle 520. The opening 708 may have the same shape as the second opening 534 of the nozzle 520. In one embodiment, the second opening 534 of the nozzle 520 and the opening 708 of the liner 522 both have a race track cross sectional shape. The second end 704 may extend beyond the first chamber wall 124 (FIG. 1A). The second end 704 may include a portion 714. In one embodiment, the portion 714 is an arc and is substantially parallel to a portion of the support ring 148 (FIG. 1A). An expanding channel 712 is formed within the liner 522, and the expanding channel 712 may expand in the dimension D that is substantially perpendicular to the fluid flow path from the opening 708 to the second end 704. The expanding channel 712 reduces flow constriction of the radicals. One or more openings 710 may be formed in the liner 522 for one or more fastening devices (not shown) to secure the liner 522 to the chamber body 125 (FIG. 5).

Figure 8:
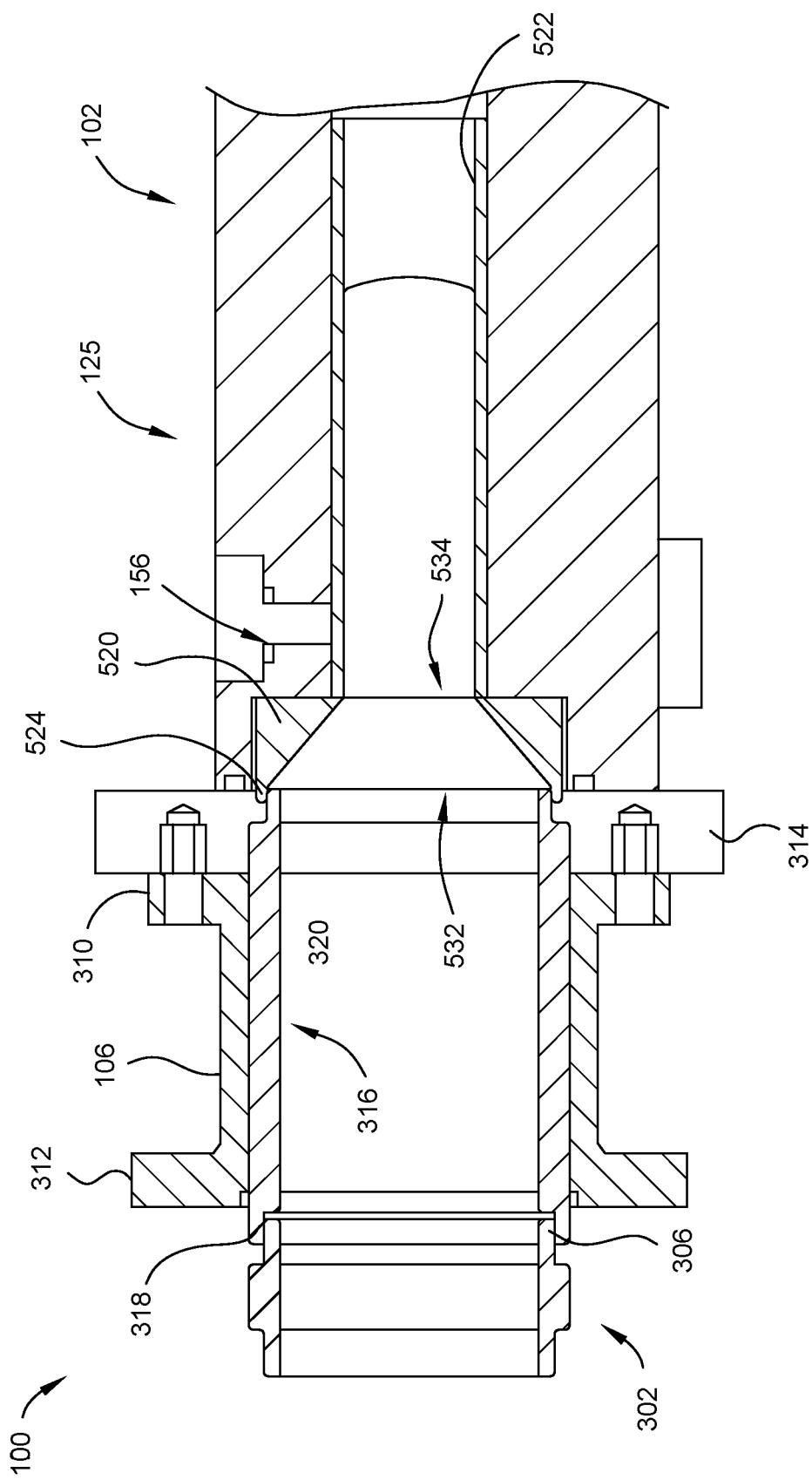
FIG. 8 is a cross-sectional side view of a portion of the process system of FIGS. 1A-1C according to embodiments described herein.

FIG. 8 is a cross-sectional side view of a portion of the process system 100 of FIGS. 1A-1C according to embodiments described herein. As shown in FIG. 8, the process system 100 includes the connector 106 coupled to the first side 124 of the chamber body 125 of the process chamber 102 via the connector plate 314. The connector 106 includes the first flange 310 coupled to the connector plate 314 and the second flange 312 coupled to the remote plasma source 104 (FIG. 1A). The liner 316 may be located within the connector 106 and may include the first end 318 and the second end 320 opposite the first end 318. The coupling liner 302 may be coupled to the liner 316, and the coupling liner 302 may be located within the remote plasma source 104 (FIG. 1A). The coupling liner 302 may include the second end 306 that fit securely in the first end 318 of the liner 316.

The liner assembly 156 may include the nozzle 520 and the liner 522 in contact with the nozzle 520. The end 524 of the nozzle 520 may surround the second end 320 of the liner 316. The end 524 forms the first opening 532 facing the liner 316. The outer diameter of the second end 320 of the liner 316 may be slightly smaller than the opening 532, so the second end 320 of the liner 316 can fit securely in the first opening 532. The second end 320 may be coupled to the end 524 in any suitable fashion. The second opening 534 has a shape that matches the shape of the opening 708 (FIG. 7) formed in the liner 522. During operation, radicals formed in the remote plasma source 104 flow through the coupling liner 302, the liner 316, and the liner assembly 156 into the processing region 146 of the process chamber 102. Because the liners 302, 316 and the liner assembly 156 are fabricated from a material that is oxidation resistant, such as quartz, the radicals do not recombine when contacting surfaces of the liners 302, 316 and the liner assembly 156. In addition, because the cross-sectional area of the second opening 534 is the same as or greater than the cross-sectional area of the first opening 532, the flow of the radicals are not constricted, leading to increased radical concentration and flux in the processing region 146.

FIG. 9A is a perspective view of the liner 522 according to embodiments described herein. As shown in FIG. 9A, the liner 522 includes the first end 702 and the second end 704 opposite the first end 702. The first end 702 may face the connector 106 and the remote plasmas source 104 (FIG. 1A) and the second end 704 may face the processing region 146 of the process chamber 102 (FIG. 1A). The liner 522 further includes a top surface 902 and a bottom surface 904 opposite the top surface 902. The expanding channel 712 is formed in the liner 522 between the top surface 902 and the bottom surface 904. A slot 906 may be formed in the bottom surface 904 and the slot 906 includes a first portion 908 located between a second portion 910 and a third portion 912, as shown in FIG. 9A. The first portion 908 of the slot 906 is larger than the second portion 910 and the third portion 912 of the slot 906.

FIG. 9B is a perspective view of the flow divider 190 according to embodiments described herein. As shown in FIG. 9B, the flow divider 190 has the first end 410, the second end 412 opposite the first end 410, and surfaces 414, 416 connecting the first end 410 and the second end 412. A recess 920 may be formed in the second end 412. The recess 920 is utilized to secure the flow divider 190 in the liner 522 by a securing device. FIG. 9C is a perspective view of a securing device 930 according to embodiments described herein. The securing device 930 includes a first portion 932 and a second portion 934. The first portion 932 has a size that can fit into the first portion 908 of the slot 906 formed in the bottom surface 904 of the liner 522. The size of the first portion 932 is larger than the second portion 910 and the third portion 912 of the slot 906, so the first portion 932 secured in the slot 906. The second portion 934 of the securing device 930 is larger than the first portion 932 so the second portion 934 rests on the bottom surface 904 of the liner 522 to prevent the securing device 930 from fall through the first portion 908 of the slot 906. The second portion 934 is sized to fit in the recess 920 of the flow divider 190.

Figure 10:
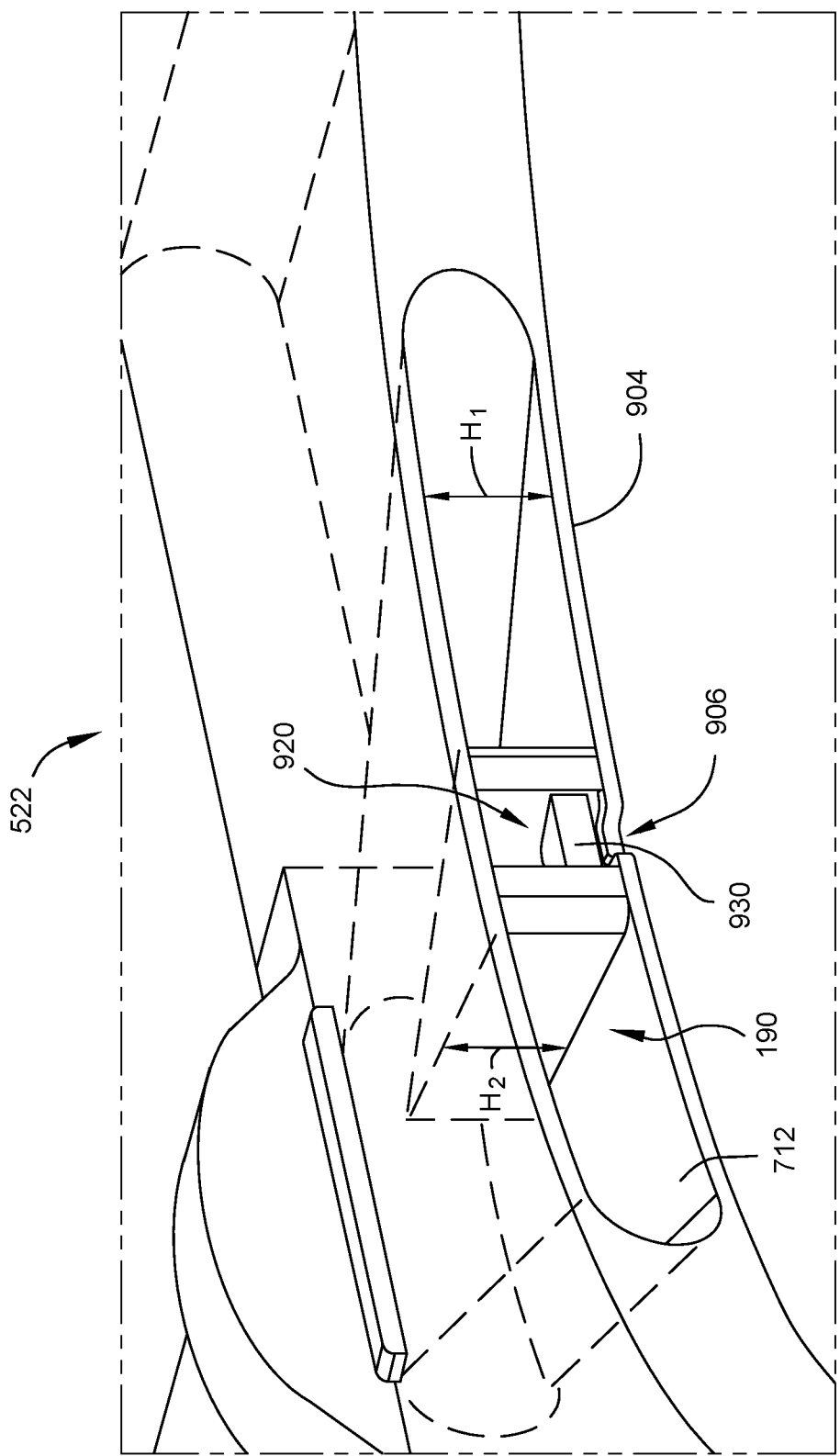
FIG. 10 is a schematic top view of the process system according to embodiments described herein.

FIG. 10 is a perspective view of the flow divider 190 secured in the liner 522 by the securing device 930 according to embodiments described herein. As shown in FIG. 10, the second portion 934 of the securing device 930 is secured to the bottom surface 904 of the liner 522 since the first portion 932 (FIG. 9C) is secured to the first portion 908 (FIG. 9A) of the slot 906 formed in the bottom surface 904 of the liner 522. The flow divider 190 is secured in the liner 522 since the second portion 934 of the securing device 930 fits in the recess 920 of the flow divider 190. The flow divider 190 is prevented from falling into the process chamber 102 by the securing device 930, as shown in FIG. 10. The expanding channel 712 in the liner 522 has a height $H_1$, and the flow divider 190 has a height $H_2$. The height $H_2$ may be slightly smaller than the height $H_1$, so the flow divider 190 can be fit tightly in the expanding channel 712 of the liner 522. In some embodiments, the height $H_2$ is much smaller than the height $H_1$, such as 75 percent of $H_1$, 50 percent of $H_1$, or 25 percent of $H_1$.

While the foregoing is directed to embodiments of the present disclosure, other and further embodiments of the disclosure may be devised without departing from the basic scope thereof, and the scope thereof is determined by the claims that follow.

What is claimed is:

1. A liner member for a semiconductor processing chamber, comprising:
    a nozzle comprising a first end with a first opening and a second end with a second opening opposite the first end, the first opening of the nozzle having a circular cross section and the second opening of the nozzle having an ellipsoid cross section that is wider and shallower than the first opening of the nozzle, the second opening of the nozzle having a cross sectional area equal to or greater than a cross sectional area of the first opening of the nozzle, wherein an entire perimeter of the first opening of the nozzle and an entire perimeter of the second opening of the nozzle are directly connected by a continuously tapered surface;
    a liner comprising a first end with a first opening and a second end with a second opening opposite the first end, the first end of the liner directly coupled to the second end of the nozzle, the second opening of the liner having a cross section that is wider than a cross section of the first opening of the liner and has substantially the same height; and
    a channel formed in the liner member and extending from the first end of the nozzle to the second end of the liner, wherein the channel is wider at the second end of the liner than at the first end of the nozzle and shallower at the second end of the liner than at the first end of the nozzle.

2. The liner member of claim 1, further comprising a protrusion disposed in the channel.

3. The liner member of claim 2, further comprising a flow divider disposed in the channel, wherein the flow divider is secured to the liner member by the protrusion, and wherein the flow divider has a height less than a height of the liner.

4. A liner assembly, comprising:
    a connector comprising a first end with a first opening and a second end with a second opening opposite the first end, the second opening of the connector having a cross sectional area equal to or greater than a cross sectional area of the first opening of the connector, the first end of the connector further comprising a first flange extending radially outward from the first opening of the connector and the second end of the connector further comprising a second flange extending radially outward from the second opening of the connector;
    a nozzle comprising a first end with a first opening and a second end with a second opening opposite the first end, the first end of the nozzle directly coupled to the second end of the connector, the first opening of the nozzle having a circular cross section and the second opening of the nozzle having an ellipsoid cross section that is wider and shallower than the first opening of the nozzle, the second opening of the nozzle having a cross sectional area equal to or greater than a cross sectional area of the first opening of the nozzle, wherein an entire perimeter of the first opening of the nozzle and an entire perimeter of the second opening of the nozzle are directly connected by a continuously tapered surface;

a liner comprising a first end with a first opening and a second end with a second opening opposite the first end, the first end of the liner directly coupled to the second end of the nozzle, the second opening of the liner having a cross section that is wider than a cross section of the first opening of the liner and has substantially the same height; and a conduit formed through the liner assembly and extending from the first end of the connector to the second end of the liner, the conduit defining a fluid flow path, wherein the fluid flow path expands in a first direction substantially perpendicular to the major axis of the fluid flow path and narrows in a second direction substantially perpendicular to the major axis of the fluid flow path and the first direction.

5. The liner assembly of claim 4, wherein the first opening and the second opening of the connector are circular.

6. The liner assembly of claim 4, wherein the second opening of the liner has an ellipsoid shape.

7. The liner assembly of claim 6, wherein the first opening of the liner has an ellipsoid shape.

8. The liner assembly of claim 4, wherein the first opening of the nozzle has a larger diameter than the second opening of the connector.

9. The liner assembly of claim 4, further comprising a flow divider disposed in the liner.

10. The liner assembly of claim 9, further comprising a protrusion formed on an inner surface of the liner, wherein the flow divider is secured to the liner by the protrusion.

11. A process system, comprising:
a process chamber, comprising:
  a substrate support portion;
  a chamber body coupled to the substrate support portion, wherein the chamber body comprises a first side and a second side opposite the first side, the chamber body and the substrate support portion cooperatively defining a processing volume;
  a distributed pumping structure located in the substrate support portion adjacent to the second side; and
  a liner assembly disposed in the first side, wherein the liner assembly comprises:
    a nozzle comprising a first end with a first opening and a second end with a second opening opposite the first end, the first opening of the nozzle having a circular cross section and the second opening of the nozzle having an ellipsoid cross section that is wider and shallower than the first opening of the nozzle, the second opening of the nozzle having a cross sectional area equal to or greater than a cross sectional area of the first opening of the nozzle, wherein an entire perimeter of the first opening of the nozzle and an entire perimeter of the second opening of the nozzle are directly connected by a continuously tapered surface; and a liner comprising a first end with a first opening and a second end with a second opening opposite the first end, the first end of the liner directly coupled to the second end of the nozzle, the second opening of the liner having a cross section that is wider than a cross section of the first opening of the liner and has substantially the same height; and a remote plasma source coupled to the process chamber by a connector, the connector comprising a first end with a first opening and a second end with a second opening opposite the first end, the second opening of the connector having a cross sectional area equal to or greater than a cross sectional area of the first opening of the connector, wherein the second end of the connector is connected to the first end of the nozzle of the liner assembly to form a fluid flow path from the remote plasma source to the processing volume, wherein the fluid flow path expands in a first direction substantially perpendicular to the major axis of the fluid flow path and narrows in a second direction substantially perpendicular to the major axis of the fluid flow path and the first direction.

12. The process system of claim 11, wherein the distributed pumping structure comprises two pumping ports.

13. The process system of claim 12, wherein the two pumping ports are spaced apart along a line that is perpendicular to a gas flow path.

14. The process system of claim 13, wherein the two pumping ports are disposed symmetrically with respect to a central axis of the process chamber.

15. The process system of claim 12, further comprising two valves, wherein each valve is connected to a corresponding pumping port of the two pumping ports.

16. The process system of claim 11, wherein a flow divider is disposed in the liner, the flow divider having a height less than a height of the liner.

17. The process system of claim 11, wherein the connector comprises quartz.

18. The liner assembly of clam 6, wherein the connector further comprises a second liner disposed therein, the second liner having a wall thickness at the first end of the connector less than a wall thickness at a central portion of the connector.

19. The process system of claim 11, wherein the connector further comprises a second liner disposed therein, the second liner having a shape at the second end of the connector matching a shape of the first opening of the nozzle.

20. The process system of claim 19, wherein the second liner has a wall thickness at the first end of the connector less than a wall thickness at a central portion of the connector.

* * * * *